(12) United States Patent
Bluck et al.

(10) Patent No.: US 6,517,691 B1
(45) Date of Patent: Feb. 11, 2003

(54) SUBSTRATE PROCESSING SYSTEM

(75) Inventors: Terry Bluck, Santa Clara, CA (US);
John Les Hughes, Rodeo, CA (US);
Eric C. Lawson, Sunnyvale, CA (US);
Tatsuru Tanaka, Campbell, CA (US)

(73) Assignee: Intevac, Inc., Santa Clara, CA (US)

( * ) Notice: Subject to any disclaimer, the term of this patent is extended or adjusted under 35 U.S.C. 154(b) by 0 days.

(21) Appl. No.: 09/562,039

(22) Filed: May 1, 2000

Related U.S. Application Data

(63) Continuation-in-part of application No. 09/137,361, filed on Aug. 20, 1998, now Pat. No. 6,183,831.

(51) Int. Cl.[7] .......................... C23C 14/34; C23C 16/00
(52) U.S. Cl. ............ 204/298.25; 118/719; 204/298.35; 156/345; 414/217; 414/221; 414/222.07; 414/222.09; 414/222.12; 414/222.13; 414/225.01; 414/223.02; 414/226.05; 414/938
(58) Field of Search ........................ 204/298.25, 298.35; 118/719; 156/345; 414/217, 221, 222.07, 222.09, 222.12, 222.13, 223.02, 225.01, 226.05, 938

(56) References Cited

U.S. PATENT DOCUMENTS

| | | | | |
|---|---|---|---|---|
| 4,500,407 A | * | 2/1985 | Boys et al. | 204/298.25 |
| 4,920,919 A | * | 5/1990 | Matsudaira et al. | 118/725 |
| 5,215,420 A | * | 6/1993 | Hughes et al. | 414/217 |
| 5,705,044 A | * | 1/1998 | Washburn et al. | 204/298.25 |
| 6,139,695 A | | 10/2000 | Washburn et al. | |

* cited by examiner

*Primary Examiner*—Rodney G. McDonald
(74) *Attorney, Agent, or Firm*—Stanley Z Cole; William McClellan

(57) ABSTRACT

A substrate processing system includes a primary processing assembly and secondary processing assembly. The secondary processing assembly has one or more interconnected modules and includes one or more process stations. The primary and secondary processing assemblies are connected by a vacuum conveyor, so that the substrates remain in vacuum during transport. The secondary processing assembly may include one or more modules which are interconnected to provide a desired system configuration. A dual processing module, including first and second process stations, is selectably operable in a serial mode or a parallel mode.

34 Claims, 16 Drawing Sheets

SUBSTRATE PROCESSING SYSTEM

CROSS REFERENCE TO RELATED APPLICATION

This application is a continuation-in-part of application Ser. No. 09/137,361, filed Aug. 20, 1998 now U.S. Pat. No. 6,183,831.

FIELD OF THE INVENTION

This invention relates to systems and methods for processing substrates, such as magnetic disk substrates and optical disk substrates, and, more particularly, to systems and methods for processing substrates in vacuum. A modular construction may be used. Modular construction permits the addition of modules needed for a particular sequence of process steps, permits substrates to be maintained in vacuum throughout processing and permits processes to be isolated from each other. The invention also relates to a dual processing module which may operate in a serial mode or a parallel mode.

BACKGROUND OF THE INVENTION

A typical magnetic disk used in a hard disk drive may include an underlayer of chrome, one or more magnetic layers for information storage and a protective layer, such as a carbon layer. The magnetic disk may also include a lubricant layer over the carbon layer to minimize friction and to facilitate handling of disks as well as functions during operations with the read-write head. The layers are generally formed on both front and back surfaces of a suitable substrate to provide a two-sided magnetic disk. The layers may also be formed on only one surface of the substrate. Sputter coating may be utilized for forming at least some of the layers of a magnetic disk. Different layers may be formed in different process stations of a multiple process station coating system. Coating systems of this type are disclosed, for example, in U.S. Pat. No. 5,215,420 issued Jun. 1, 1993 to Hughes et al. and are commercially available from Intevac, Inc. of Santa Clara, Calif. under Model Nos. MDP250B, MDP250B+ and MDP250K. Deposition techniques other than sputter coating may also be used at one or more of the process stations. Such other deposition techniques may be used in combination with sputtering processes, as well as other deposition processes.

The above-specified coating systems include multiple process stations mounted in a circular arrangement with respect to a circular main vacuum chamber. The process stations may include metal deposition stations, magnetic layer deposition stations, carbon deposition stations, heating stations and cooling stations in a desired sequence. The system may typically further include a mechanism for the handling of substrates moving into the system and transferring from process station to process station or from a cassette to the process stations and eventually back to the cassette.

One such coating system may include multiple process stations and has included as many as twelve process stations. In this system, grippers may be used to hold substrates, and in one commercial unit, substrates supported by grippers are raised into the respective process stations simultaneously. In such systems the process times in each station are necessarily equal. Accordingly, processes that require longer than the selected process time may utilize two or more process stations. For example, a substrate may warp if it is heated too rapidly, and therefore may be heated more slowly in two or more process stations.

As magnetic disks become more sophisticated and have higher recording densities, processing requirements become more exacting. For example, additional layers may be utilized to achieve enhanced performance. The additional layers require additional process stations and may require additional heating and/or cooling stations. In addition, contaminant levels must be reduced. As process requirements become more stringent, the requirement for high throughput is maintained or increased.

The coating systems described above provide highly satisfactory performance but have a fixed number of process stations and cannot easily be modified to add process stations. Furthermore, the substrates may be exposed to limited levels of contaminants in the main vacuum chamber. Although the process stations are typically isolated from the main vacuum chamber during processing, the process stations are in fluid communication with the main vacuum chamber when the substrates are being rotated to the next process stations. Certain processes, such as chemical vapor deposition used for carbon deposition, generate particles that may adversely affect other process steps or is the substrates. Although two or more separate sputter coating systems could be utilized to meet complex process requirements, it has generally been found desirable to maintain the substrates in vacuum throughout the entire sequence of process steps. For example, exposure of the substrate to atmosphere at an intermediate stage in the sequence of process steps, may result in contamination of the substrate surface, which may adversely affect subsequent process steps or the performance of the magnetic disk. Furthermore, the use of two or more independent coating systems to implement a single process sequence would be expensive.

Accordingly, there is a need for improved methods and apparatus for substrate processing which permit the addition of process steps for particular applications, which maintain the substrate in vacuum throughout the sequence of process steps, which achieve high throughput, and which are relatively low in cost.

SUMMARY OF THE INVENTION

According to a first aspect of the invention, a substrate processing system is provided. The substrate processing system comprises a primary processing assembly and one or more secondary processing assemblies. The primary processing assembly comprises a vacuum chamber for receiving a substrate holder containing multiple substrates, a plurality of process stations positioned to be fed from within the primary processing assembly are provided for individually processing substrates. There is also provided means for transporting the substrates to and between the process stations and the substrate holder. The secondary processing assembly comprises at least one secondary process station for processing the substrates. The substrate processing system may also further comprise a vacuum conveyor for transporting the substrate is holder in vacuum between the primary processing assembly and the secondary processing assembly, wherein the substrate holder containing substrates is maintained in vacuum during transport.

The substrate processing system may further comprise at least one vacuum lock between the primary processing assembly and the secondary processing assembly, so that, if desired, the primary processing assembly may be isolated by the vacuum lock from the secondary processing assembly.

The secondary processing assembly may include serial processing. modules, parallel processing modules and batch processing modules, singly or in any combination. In one embodiment, the secondary processing assembly comprises a dual processing module including a cassette vacuum chamber for receiving a substrate holder and first and second process stations coupled to the cassette vacuum chamber. The secondary processing assembly may further comprise a cooling module for cooling substrates processed in the primary processing assembly. The vacuum conveyor may comprise a vacuum chamber, a vacuum pump connected to the vacuum chamber and a conveyor for transporting the substrates or the holder for substrates through the vacuum chamber. In another embodiment, the vacuum conveyor comprises a rotation module, including a mechanism for changing the direction of transport of the substrates or the substrate holder in vacuum.

The secondary processing assembly may comprise one or more modules connected to an input of the primary processing assembly, one or more modules connected to the output of the primary processing assembly, or both. The modules may include processing modules, vacuum lock or isolation modules, vacuum conveyor modules, cooling modules and vacuum rotation modules, for example. The modules are interconnected to provide a desired system configuration.

According to another aspect of the invention, a dual processing module is provided. The dual processing module comprises a housing defining a vacuum chamber, first and second process stations coupled to the vacuum chamber, a conveyor for transporting a substrate or a holder containing substrates into and out of the vacuum chamber, a substrate positioning mechanism for raising or for lowering a substrate into and away from a processing chamber or into and our of a substrate holder, and first and second transfer mechanisms for transferring the substrates to and between a substrate lift mechanism and the first and second process stations.

The first and second transfer mechanisms may each comprise a turntable assembly for moving first and second substrate grippers between a load/unload position and a preprocess position, a transfer arm assembly for moving a substrate between the substrate lift mechanism and the load/unload position, and a gripper lift assembly for lifting one of the grippers between the preprocess position and a process position in the respective process station.

The dual processing module may include means for selectively operating in a serial mode or in a parallel mode. In the serial mode, each substrate is processed in both the first and second process stations. In the parallel mode, odd numbered substrates are processed in the first process station and even numbered substrates are processed in the second process station.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
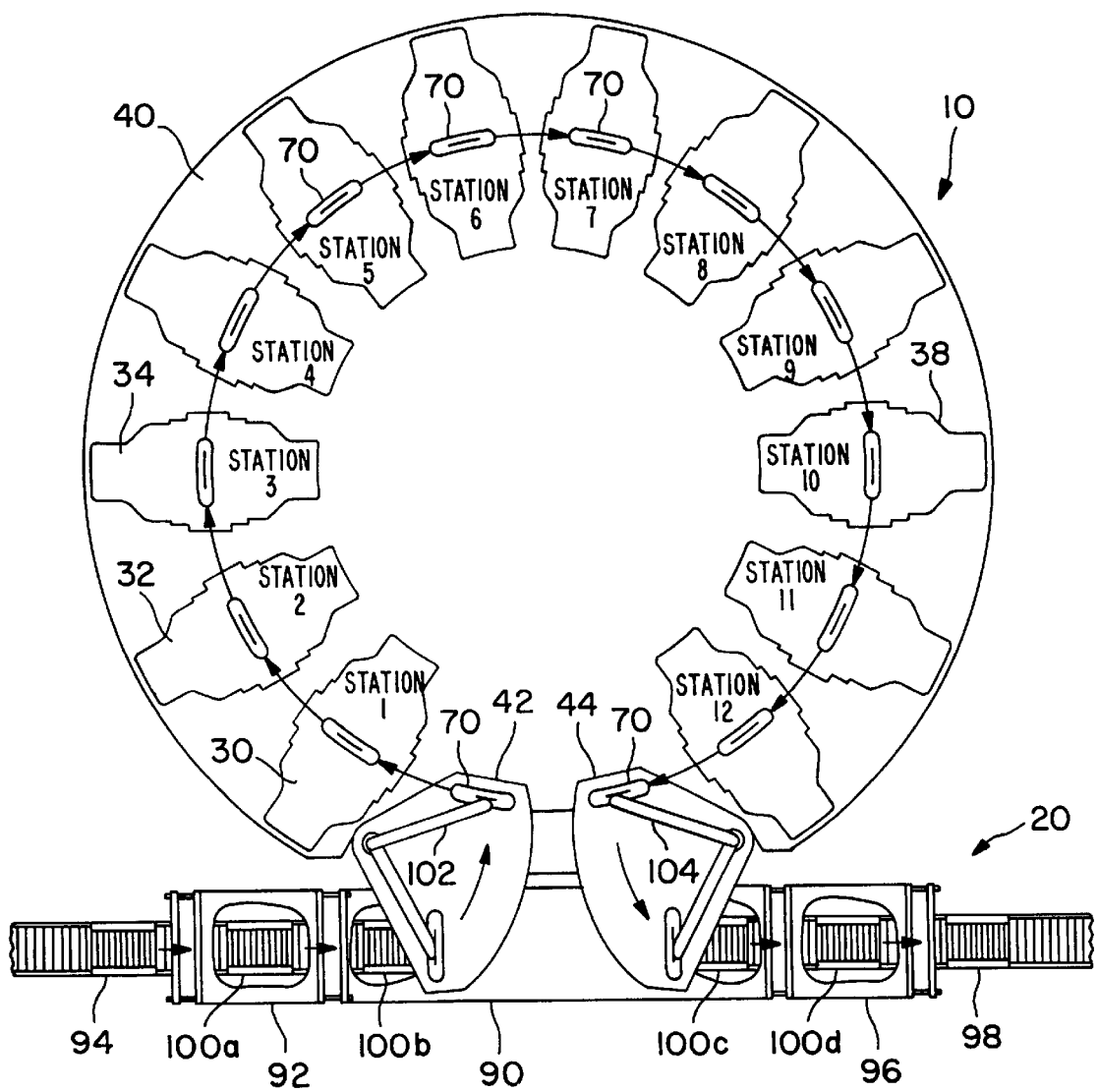
FIG. 1 is a top view of a prior art substrate processing system.
Figure 2:
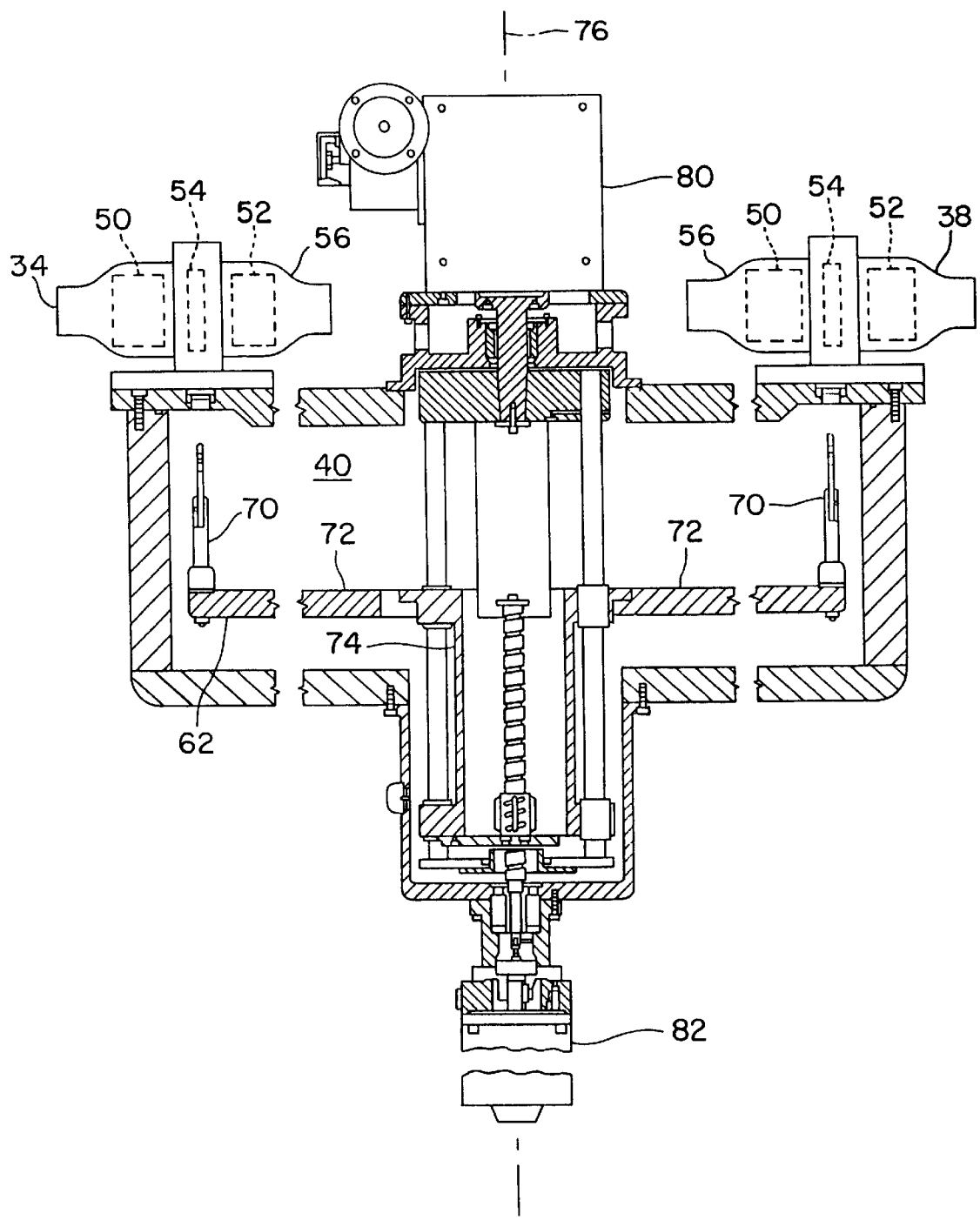
FIG. 2 is a cross-sectional side view of the substrate processing system of FIG. 1.

A prior art substrate processing system is shown in FIGS. 1 and 2, where like elements have the same reference numerals. As shown in FIG. 1, the system includes a processing unit 10 and a substrate handling system 20. The processing unit 10 includes a plurality of process stations 30, 32, 34, etc. mounted on a main vacuum chamber 40. Process stations 30, 32, 34, etc. are mounted in a circular arrangement with respect to a circular main vacuum chamber 40. Processing unit 10 further includes a loading station 42 for loading substrates into the system for processing and an unloading station 44 for unloading substrates from the system following processing. The substrates are typically substrates for magnetic disks or optical disks and include a central opening. The substrate processing system may further include vacuum pumps, power supplies and a controller (not shown).

A cross section of the processing unit 10 through process station 34 and a process station 38 is shown in FIG. 2. Process stations 34 and 38 may each include processing devices 50 and 52 positioned in opposed facing relationship on opposite sides of a substrate processing location 54. Processing devices 50 and 52 and processing location 54 are disposed within a housing 56. Processing devices 50 and 52 may be sputter coating sources, heating devices, cooling devices, or any other processing device. The processing devices in the different process stations 30, 32, 34, etc. may be the same or different, depending on the requirements of the system. In the example of FIG. 1, the system has twelve process stations, loading station 42 and unloading station 44, which are equiangularly spaced.

A carousel assembly 62 within main vacuum chamber 40 includes a plurality of substrate grippers, or disk grippers, 70 in a circular arrangement.

The disk grippers 70 are equiangularly spaced and are positioned such that they may be raised into the respective process stations. The disk grippers 70 are mounted on a carousel 72 connected to a central hub 74. Carousel assembly 62 may be rotated about an axis 76 by an indexing motor 80 so that the disk grippers 70 are aligned with respective process stations 30, 32, 34, etc., the loading station 42 and the unloading station 44. In addition, carousel assembly 62 may be raised and lowered by a drive motor 82 between a lowered position, shown in FIG. 2, and a raised position (not shown in FIG. 2). In the lowered position, the carousel assembly 62 may be rotated about axis 76 into alignment with selected process stations. In the raised position, the substrates are positioned at processing locations 54 within the respective process stations 30, 32, 34, etc., the loading station 42 and the unloading station 44.

Referring again to FIG. 1, substrate handling system 20 includes a buffer vacuum chamber 90, a load lock 92, an entrance conveyor 94, an unload lock 96 and an exit conveyor 98. Cassettes 100a, 100b, 100c and 100d carrying substrates for processing enter buffer vacuum chamber 90 through load lock 92 and exit from buffer vacuum chamber 90 through unload lock 96. A load arm 102, in this configuration, transfers substrates from cassette 100b to disk gripper 70 in loading station 42. An unload arm 104 transfers substrates from disk gripper 70 in unloading station 44 to cassette 100c. Substrate handling system 20 is described in detail in the aforementioned U.S. Pat. No. 5,215,420, which is hereby incorporated by reference.

According to a feature of the invention, one or more modules may be added to a substrate processing system, shown by way of example in FIGS. 1 and 2 and described above, to form an enhanced substrate processing system. In particular, the enhanced substrate processing system may include a primary processing assembly, such as the processing assembly shown in FIGS. 1 and 2, and a secondary processing assembly, which may comprise one or more modules that are added to the primary processing assembly. Examples of suitable modules are shown schematically in FIGS. 5–9. The modules of the secondary processing assembly are configured such that substrates are transferred in vacuum from the primary processing assembly to the secondary processing assembly and from the secondary processing assembly to the primary processing assembly. Furthermore, the primary processing assembly is isolated from the secondary processing assembly by one or more vacuum isolation chambers to minimize the movement of contaminants between assemblies. Modules can be added to the enhanced substrate processing system to increase the available number of process stations, to provide increased flexibility in processing, to isolate processes that generate contaminants from others that are sensitive to contaminants, or for any other reason.

Figure 3:
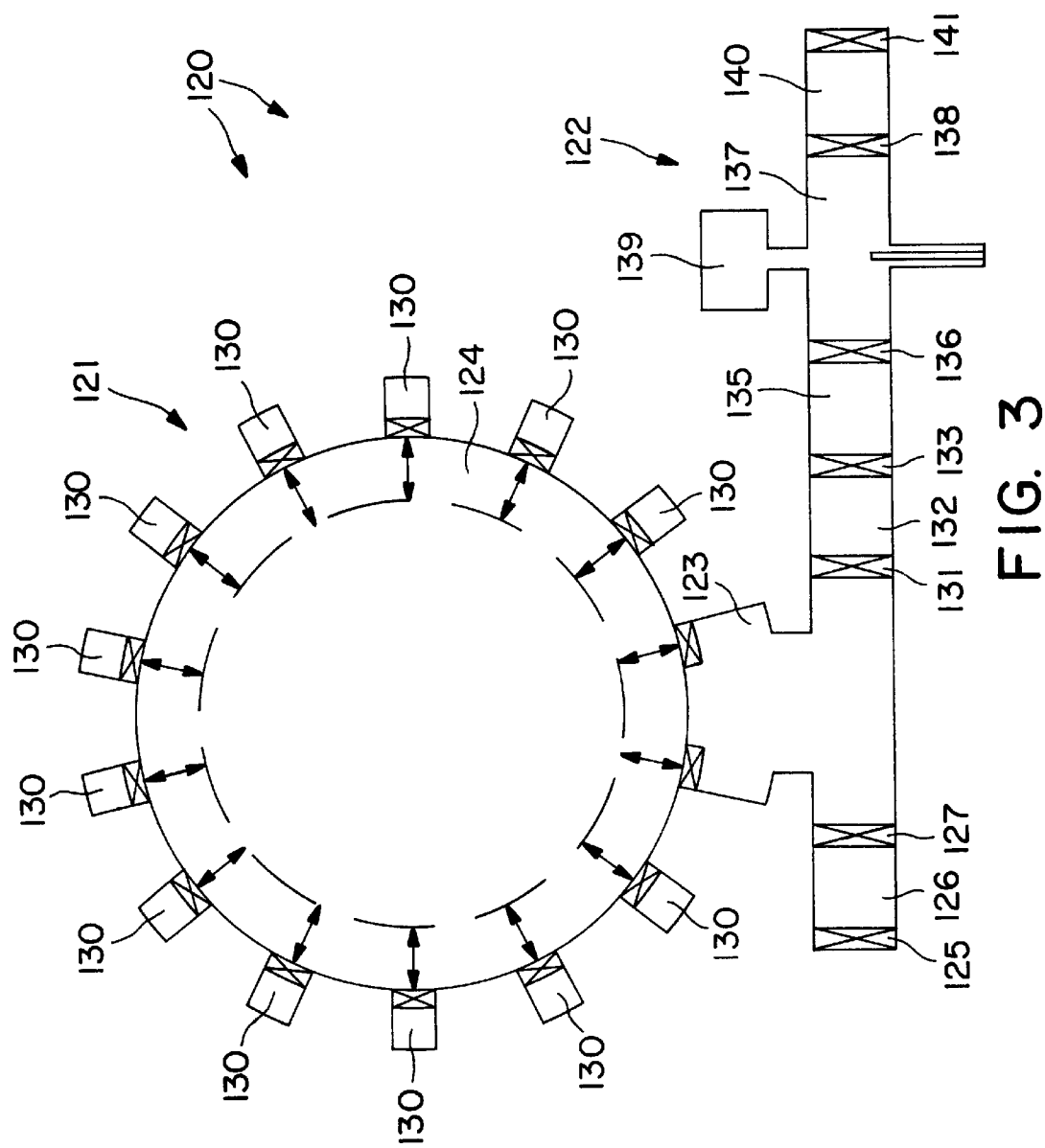
FIG. 3 is a schematic top view of a disk lubrication module attached to a substrate processing system to permit magnetic disk manufacture, followed by the deposition of a lubricant layer, in which the disk is maintained in vacuum throughout the various thin film deposition steps until after deposition of the lubricant layer.

Referring now to FIG. 3, there is illustrated apparatus 120 that may be employed as a production coater for deposition of thin film layers including lubrication layers. At the upper section of FIG. 3 and designated 121 there is generally shown a disk coating system for depositing the various base or underlayers as well as the magnetic layers. This may comprise equipment as described in U.S. Pat. No. 5,215,420 or like equipment for the same purpose. Note that, in this embodiment, the processing stations are not exclusively located mounted onto the central chamber or core. At the lower section and generally designated 122, there is illustrated a disk lubrication section. The lubrication section is illustrated in greater detail in FIG. 4. Like elements in FIGS. 3 and 4 have the same reference numerals. These two main sections of the production deposition and lubrication coater are joined through a transfer lock 135. The disk coating system 121 is maintained under vacuum with each station 130 along the central chamber having independent sealing systems as to create independently controlled vacuums at each station. This permits movement of articles to be treated around the central chamber in a vacuum environment and transfer of such articles to one or more process stations. At a process station, for example for sputter deposition, vacuum conditions are also required.

In the equipment of FIG. 3, there are shown twelve process stations 130. Independently controlled stations permit the separate processing of articles simultaneously in different process stations and processing of articles in different ways in different process stations simultaneously.

In normal operation, a cassette of blanks or substrates enters the apparatus at the lower left hand corner in FIG. 3 through entrance gate 125. The cassette then moves through load lock 126 and post load lock gate 127. In the coating system buffer lock 123, the articles or disk substrates are unloaded from the cassette onto lift blades, as is described in U. S. Pat. No. 5,215,420, which transport the substrates into the apparatus for processing. The lift blade positions the disk in the main chamber 124 and from the main chamber into a process station 130 for processing. Processing may comprise any number of deposition or other process steps including the sputtering of a chromium layer after which the article may be moved to another process station where a cobalt alloy, for example, may be deposited on the surface of the disk. After that the deposition of a carbon or other protective layer takes place in another process station. The carbon or other protective layer may be deposited using sputtering technology or alternatively, for example, using a process of chemical vapor deposition as is described in U.S. pending patent application in the name of Bluck et al., Ser. No. 09/076,971 filed May 13, 1998, now U.S. Pat. No. 6,203,862. A blade with a disk seated thereon lowers the disk back into an empty position in the cassette in buffer lock 123. In this embodiment, disks in cassettes then move into the disk lubrication section of the equipment. First they pass through isolation gate 131 and then through isolation gate 132. Such an arrangement of isolating the disks in different processes is employed when it is desired to isolate the next process steps from the previous steps or procedures.

Figure 4:
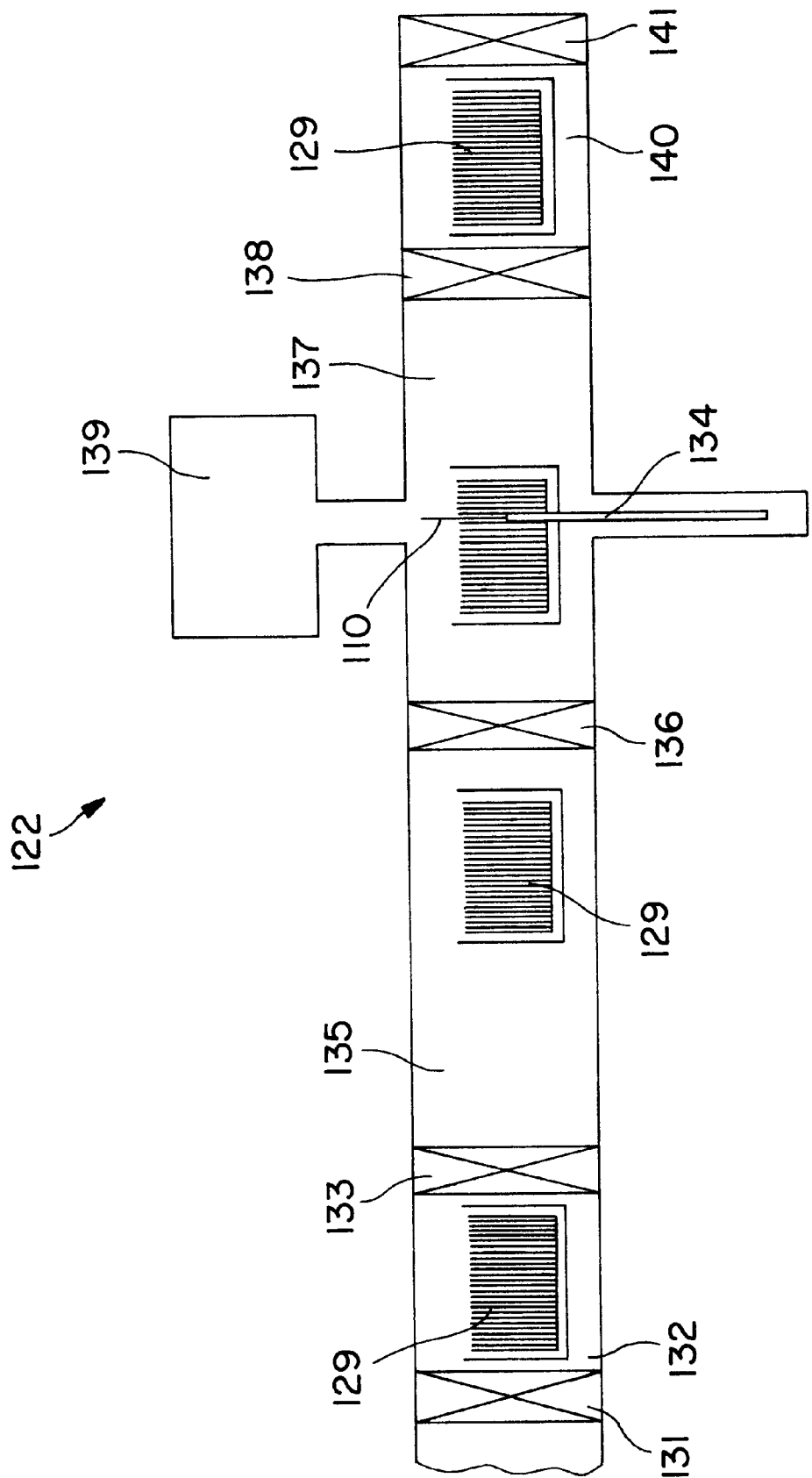
FIG. 4 is a schematic side view of the disk lubrication section of the system shown in FIG. 3.

To facilitate understanding, FIG. 4 shows the lubrication section in an enlarged drawing. In this embodiment, cassette 129 transfers through exit gate 133 and enters transfer lock 135 after which it enters vacuum lubrication main chamber 137 through transfer gate 136. The disk 110 is raised out of the cassette with a lift blade 134 for coating with a lubricant in vacuum lubrication process station 139, and then the disk, after deposition of a lubricant layer, is placed back into the same cassette in the vacuum lubrication main chamber 137 and is transported out of the apparatus at exit gate 141 after passing through unload gate 138 and unload lock 140. Disks are maintained under vacuum conditions as they travel from the main chamber 124 or from a process station 130 at the main chamber 124 to and through vacuum lubrication chamber 139. Although the description has included moving a cassette with substrates through the various isolation chambers such as 135 and 137, the substrate or disk may in fact be moved without such substrate holders, combining the substrate into a cassette holder at the end of the cycle after exiting through gate 141.

The disk is coated with a thin uniform coating of a lubricant by vacuum evaporation in the vacuum lubrication process chamber 139. In this system, evaporation occurs in vacuum onto freshly deposited carbon which has not been exposed to atmosphere. This is believed critical to the success of the process in which a lubricant is deposited onto the substrate surface. It is known that carbon which has been freshly deposited by sputtering, chemical vapor deposition, or other deposition process, and which has not been exposed to atmosphere is highly reactive. As has been described, exposing such a surface to atmosphere results in contamination of the surface, which impacts the quality and uniformity of any deposited lubricant layer. Evaporation of a lubricant onto such a carbon surface before exposure to atmosphere appears to bring about chemical bonding between the carbon and the deposited lubricant which, it is presently thought, creates a unique bond as to improve results achieved over simply depositing lubricant onto a disk after exposure to atmosphere.

Additional details of the process and apparatus for depositing a lubricant layer on the disk are disclosed in application Ser. No. 09/137,361, which is hereby incorporated by reference in its entirety.

Figure 5:
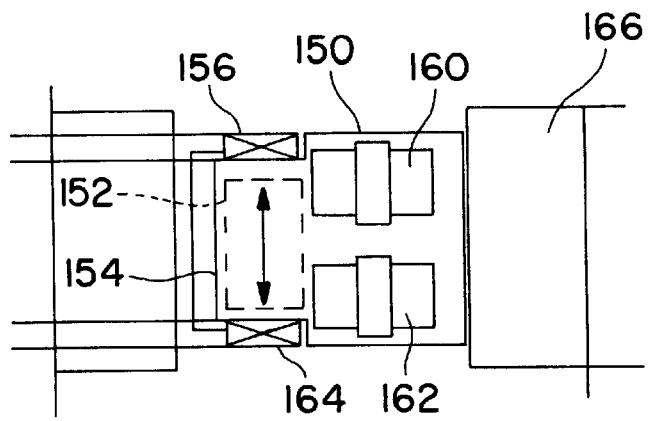
FIG. 5 is a schematic view of a dual processing module in accordance with the invention.

A schematic diagram of a dual processing module 150 is shown in FIG. 5. In this embodiment a cassette 152 carrying substrates is moved into a cassette vacuum chamber 154 through a gate valve 156. Substrates are transferred one at a time from cassette 152 to a first process station 160 or a second process station 162 for processing. The process stations 160 and 162 may be used for sputter deposition of a desired layer on the substrate, for heating, for cooling, or for any other desired process. The process station may be utilized to deposit an underlayer, a magnetic layer, a protective carbon layer, a thin uniform film of lubricant, or any other desired layer on the substrate. The process stations 160 and 162 may perform the same or different processes. As described in detail below, the dual processing module 150 may operate in a serial mode or in a parallel mode. Following processing, the substrates are returned to cassette 152 and the cassette 152 is moved from cassette vacuum chamber 154 through a gate valve 164. Cassette 152 may be moved into and out of cassette vacuum chamber 154 in either direction. A controller 166 controls the operation of the elements of the dual processing module 150 as described below.

Figure 6:
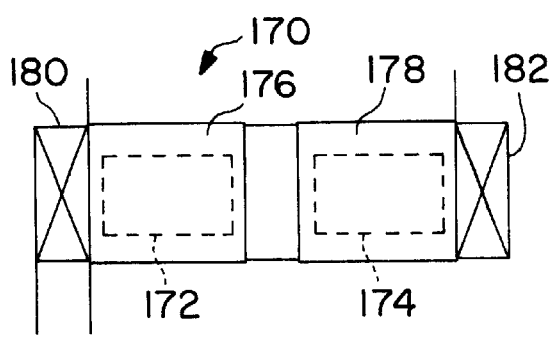
FIG. 6 is a schematic view of a cassette cooling module in accordance with the invention.

A dual batch processing module 170 is shown schematically in FIG. 6. Cassettes 172 and 174 carrying substrates enter process chambers 176 and 178, respectively, through a gate valve 180. Process chambers 176 and 178 may be connected to a vacuum pump (not shown). The substrates in cassettes 172 and 174 in this instance may be processed in a batch. Examples of suitable batch processes include, but are not limited to, heating and cooling of substrates. Following processing, cassettes 172 and 174 are moved from batch processing module 170 through a gate valve 182. Batch processing module 170 includes a cassette conveyor for transporting cassettes 172 and 174 into and out of the module.

Figure 7:
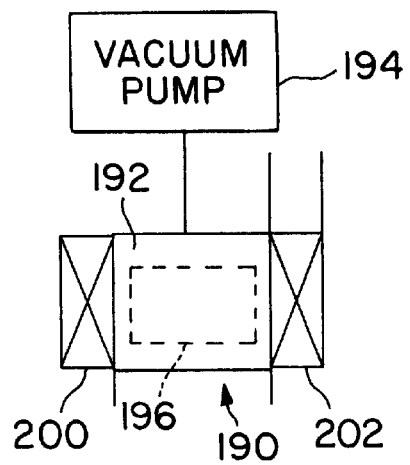
FIG. 7 is a schematic view of a vacuum conveyor module in accordance with the invention.

A vacuum conveyor module 190 is shown schematically in FIG. 7. Vacuum conveyor module 190 includes a cassette vacuum chamber 192, which may be connected to a vacuum pump 194. The vacuum conveyor module 190 further includes a cassette conveyor (not shown) for transporting a cassette 196 into and out of cassette vacuum chamber 192. Gate valves 200 and 202 provide access to cassette vacuum chamber 192.

Vacuum conveyor module 190 may have one of several configurations. In a first configuration, the vacuum conveyor module 190 is utilized for transporting cassettes from one module to another. In this configuration, cassette vacuum chamber 192 may or may not be connected to a vacuum pump. If cassette vacuum chamber 192 is not connected to a vacuum pump, the module is connected to another module that is vacuum pumped. In a second configuration, cassette vacuum chamber 192 is connected to a roughing vacuum pump, and the vacuum conveyor module 190 is utilized as a roughing vacuum lock module. In a third configuration, cassette vacuum chamber 192 is connected to a high vacuum pump, and vacuum conveyor module 190 is utilized as a high vacuum lock module. Vacuum modules of the type being discussed in connection with FIG. 7 may be used as compartments 132 or 135 as shown in FIG. 4.

Figure 8:
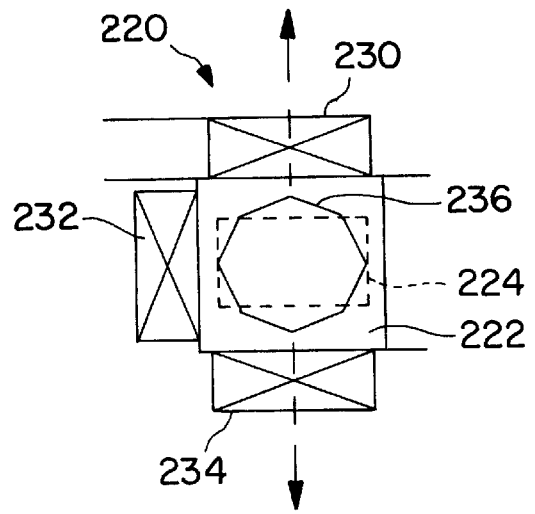
FIG. 8 is a schematic view of a vacuum rotation module in accordance with the invention.

A vacuum rotation module 220 is shown schematically in FIG. 8. A rotation vacuum chamber 222 is connected to a high vacuum pump (not shown). A cassette 224 containing substrates is transported into and out of rotation vacuum chamber 222 by a cassette conveyor (not shown). Gate valves 230, 232 and 234 provide access to rotation vacuum chamber 222. Vacuum rotation module 220 further includes a turntable 236 for rotating cassette 224 through 90°. By way of example, cassette 224 may enter rotation vacuum chamber 222 through gate valve 232, may be rotated through 90° by turntable 236 and may exit from rotation vacuum chamber 222 through gate valve 234 or alternatively through gate valve 230.

Figure 9:
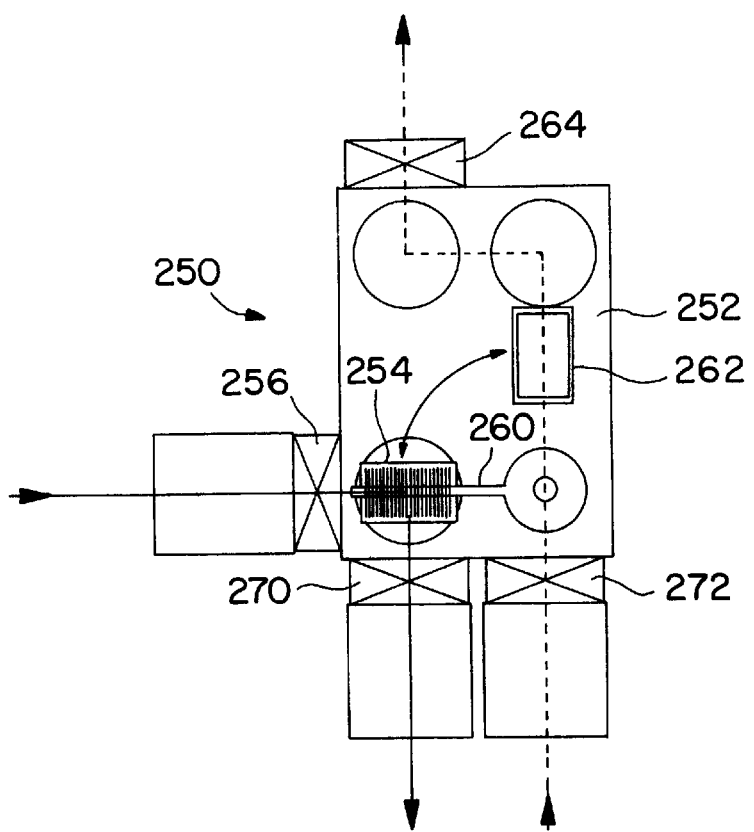
FIG. 9 is a schematic view of a cassette transfer module in accordance with the invention.

A cassette transfer module 250 is shown schematically in FIG. 9. A transfer vacuum chamber 252 is connected to a high vacuum pump (not shown). A full cassette 254 travels into the transfer vacuum chamber 252 through gate valve 256. The linear motion of the cassette travel introduces a mandrel 260 into the internal diameter (ID) of the disks. The mandrel has 25 grooves for the disks to rest in. After the cassette 254 stops traveling the mandrel is raised up, lifting all the disks out of the cassette. The mandrel is then rotated 90 degrees, over a waiting empty cassette 262. The mandrel 260 lowers, placing all the disks into the empty cassette. The now full cassette 262 then travels out of the transfer vacuum chamber through gate valve 264, removing the mandrel from the disk ID. The now empty cassette 254 is transported out of the transfer vacuum chamber through gate valve 270. The mandrel 260 is returned to its original position awaiting the next full cassette. A new empty cassette is introduced to the transfer module through gate valve 272 to receive the next batch of disks. The cassette transfer module 250 also provides rotation of cassettes in vacuum.

Figure 10:
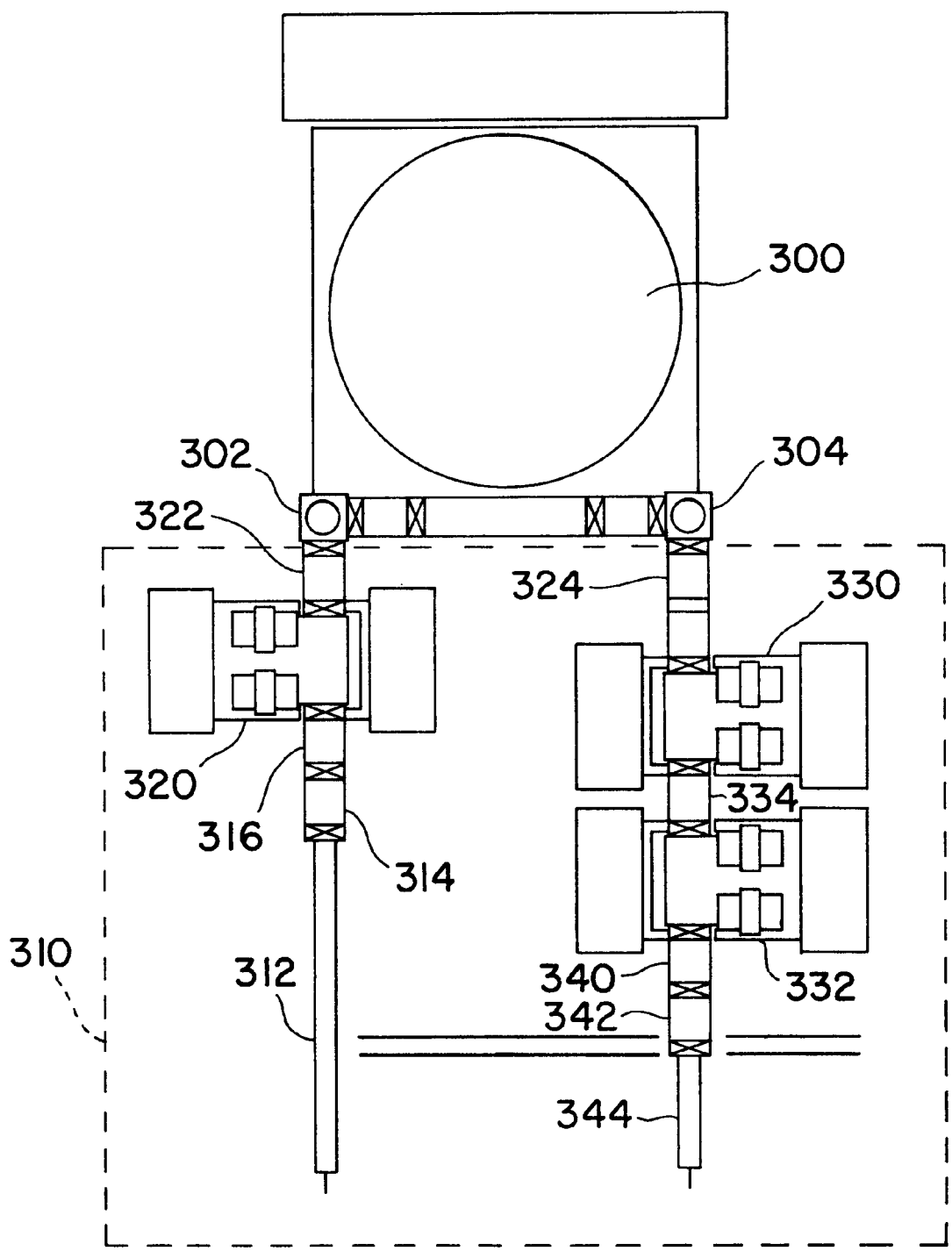
FIG. 10 is a schematic view of a substrate processing system including a primary processing assembly, one input dual processing module and two output dual processing modules.

A first embodiment of an enhanced substrate processing system in accordance with the invention is shown in FIG. 10. The enhanced substrate processing system is constructed by adding modules to a primary processing assembly 300, typically a larger structure when compared to a module but shown in this and other figures discussed from this point on as a smaller structure for illustrative purposes only. An example of a suitable primary processing system is shown in FIGS. 1 and 2 and described above. In the substrate processing system of FIG. 10, the load locks on the inputs and outputs of primary processing assembly 300 are replaced with vacuum rotation modules 302 and 304 of the type described above in connection with FIG. 8. At the input of primary processing assembly 300, a secondary processing assembly 310 includes an entrance conveyor 312, a roughing vacuum lock module 314 and a high vacuum lock module 316 coupled to an input of a dual processing module 320. The output of dual processing module 320 is coupled through a vacuum conveyor module 322 to vacuum rotation module 302. The output of primary processing assembly 300 is coupled through vacuum rotation module 304 and a cassette cooling module 324 to a dual processing module 330 and a dual processing module 332, which are interconnected through a vacuum conveyor module 334. The output of dual processing module 332 is coupled through a high vacuum lock module 340 and a roughing vacuum lock module 342 to an exit conveyor 344.

In operation, cassettes containing substrates, such as magnetic disk substrates, are transported into the system through entrance conveyor 312 and lock modules 314 and 316. The cassette is thus at the desired vacuum level when it enters dual processing module 320. An underlayer of chrome may be applied to the disk substrates in dual processing module 320. The cassette carrying the substrates is then transported through vacuum conveyor module 322 and vacuum rotation module 302 to the primary processing assembly 300. The substrates are processed according to a desired process sequence, typically for heating and application of magnetic layers. The cassette carrying the partially processed substrates exits from primary processing assembly 300 through vacuum rotation module 304 and enters cassette cooling module 324. The cassette carrying the substrates is subjected to a batch cooling process, wherein the substrates remain in the cassette and the temperature is reduced to a desired level. The cassette enters dual processing modules 330 and 332 for further processing, such as for application of a carbon overcoat. Following processing in dual processing modules 330 and 332, the cassette is transported through lock modules 340 and 342 to exit conveyor 344.

The cassette and the substrates contained therein remain in vacuum from the time they enter roughing vacuum module 314 until they exit from the system through roughing vacuum module 342. Furthermore, substrates are returned to the same slots in the cassette each time they are removed for processing. It will be noted that dual processing module 320 is isolated from primary processing assembly 300 by vacuum conveyor module 322 and vacuum rotation module 302, which function as vacuum locks. Furthermore, dual processing modules 330 and 332 are isolated from primary processing assembly 300 by vacuum rotation module 304 and cassette cooling module 324, which function as vacuum locks. Thus, contaminants are substantially isolated to the region where they are generated. In particular, contaminants generated in dual processing modules 320, 330 and 332 are substantially isolated from primary processing assembly 300, and any relatively "dirty" processes can be performed in the dual processing modules.

Figure 11:
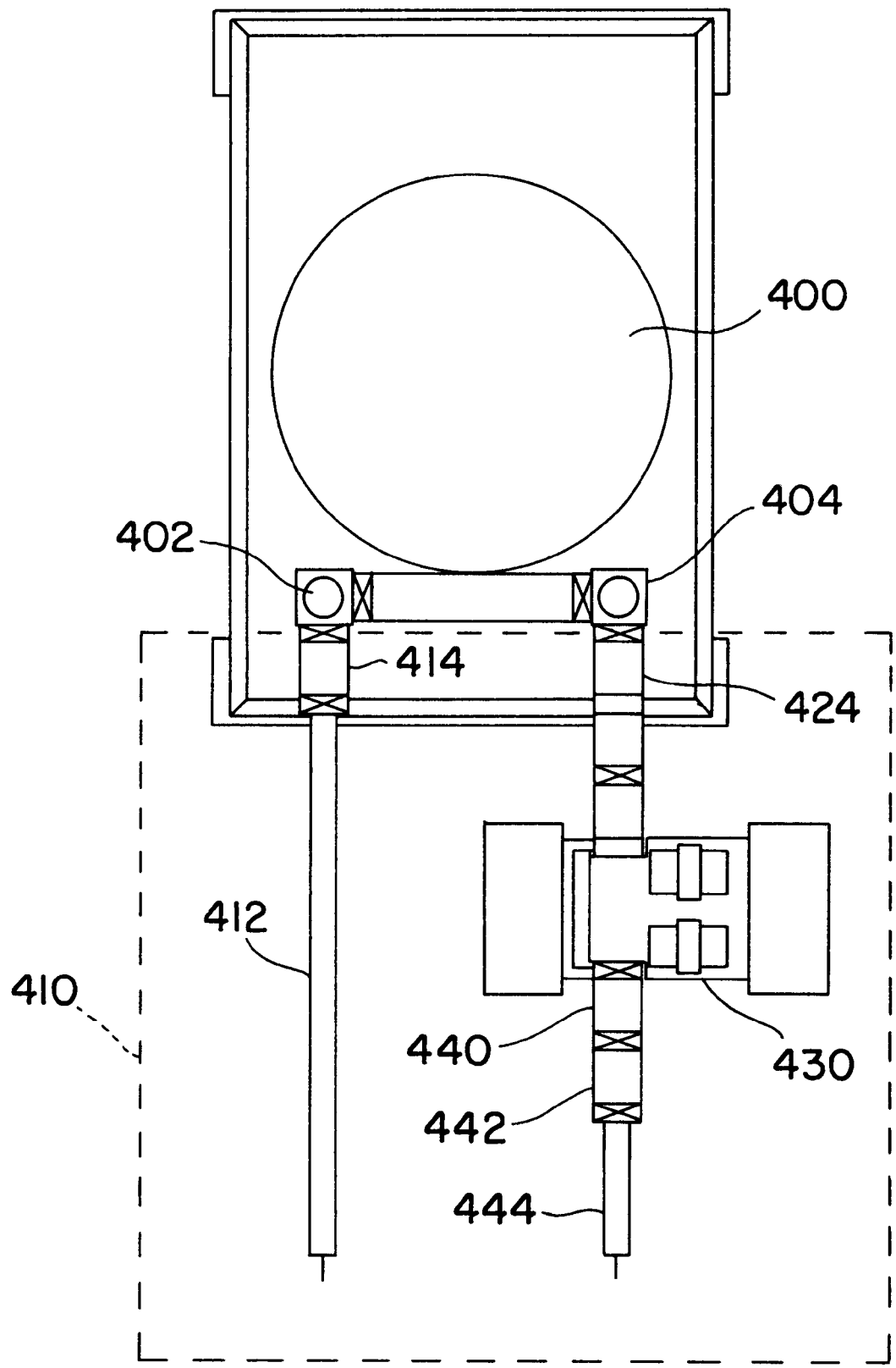
FIG. 11 is a schematic view of a substrate processing system including a primary processing assembly and one output dual processing module.

A second embodiment of an enhanced substrate processing system in accordance with the invention is shown in FIG. 11. The enhanced substrate processing system includes a primary processing assembly 400 and a secondary processing assembly 410. An example of a suitable primary processing assembly 400 is shown in FIGS. 1 and 2 and described above. Vacuum rotation modules 402 and 404 provide interfaces between primary processing assembly 400 and secondary processing assembly 410. In the embodiment of FIG. 11, vacuum rotation modules 402 and 404 function as high vacuum locks. Cassettes containing substrates are supplied to vacuum rotation module 402 via an entrance conveyor 412 and a roughing vacuum lock module 414. Following processing in primary processing assembly 400, the cassette is transported through vacuum rotation module 404 and a cassette cooling module 424 to a dual processing module 430. As described above in connection with FIG. 10, the substrates in the cassette may be cooled in cassette cooling module 424 and may be processed in dual processing module 430, such as by application of a carbon overcoat or a lubrication layer. Following processing in dual processing module 430, the cassette is transported through a high vacuum lock module 440 and a roughing vacuum lock module 442 to an exit conveyor 444.

Figure 12:
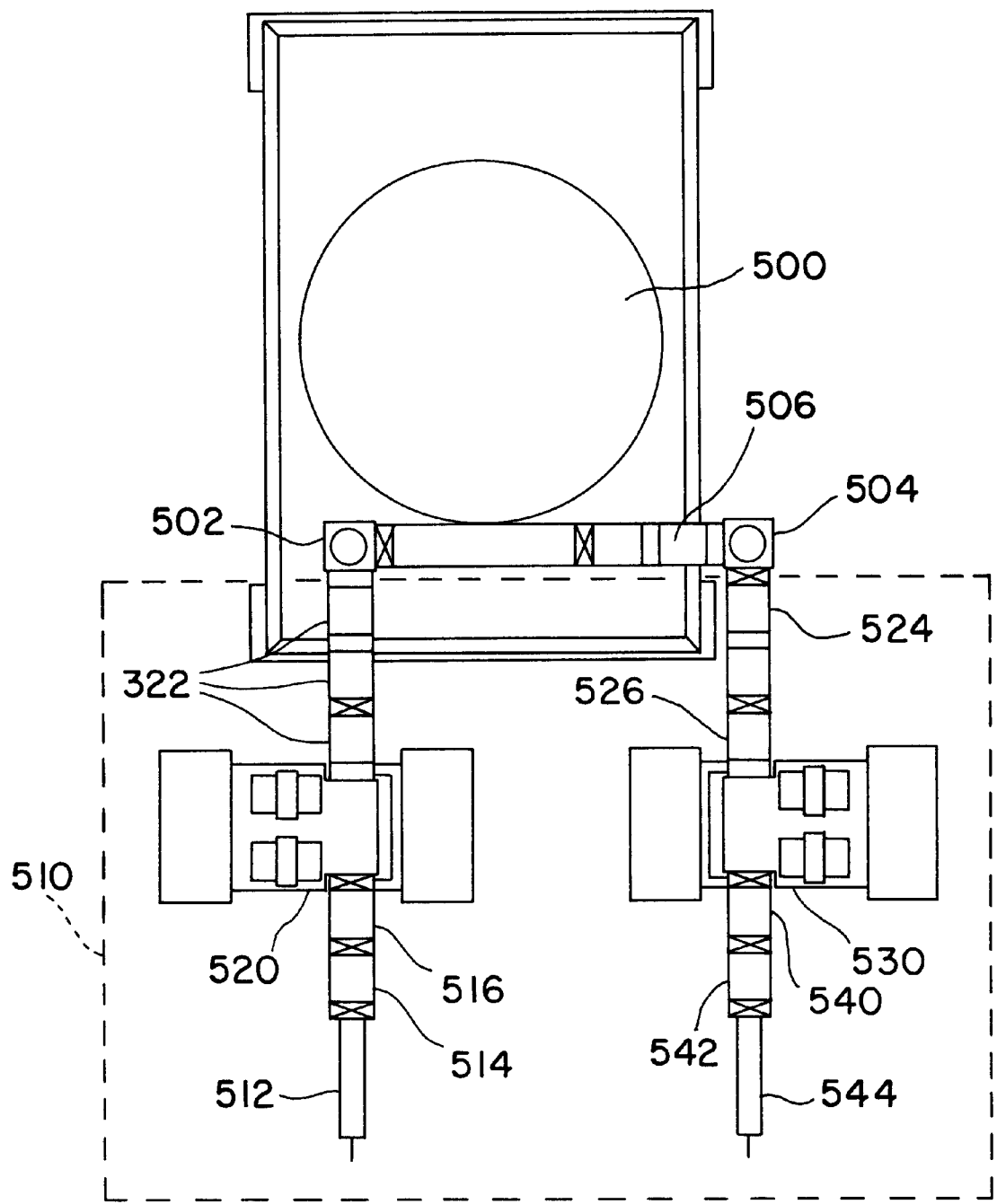
FIG. 12 is a schematic view of a substrate processing system including a primary processing assembly, one input dual processing module and one output dual processing module.

A third embodiment of an enhanced substrate processing system in accordance with the invention is shown in FIG. 12. The enhanced substrate processing system includes a primary processing assembly 500 and a secondary processing assembly 510. An example of a suitable primary processing assembly is shown in FIGS. 1 and 2 and described above. A vacuum rotation module 502 is connected between secondary processing assembly 510 and the input of primary processing assembly 500. A vacuum conveyor module 506 and a vacuum rotation module 504 are coupled between the output of primary processing assembly 500 and secondary processing assembly 510. At the input of primary processing assembly 500, secondary processing assembly 510 includes an entrance conveyor 512, a roughing vacuum lock module 514, a high vacuum lock module 516, a dual processing module 520 and three vacuum conveyor modules 322 in a series configuration. At the output of the primary processing assembly 500, secondary processing assembly 510 includes a cassette cooling module 524, a vacuum conveyor module 526, a dual processing module 530, a high vacuum lock module 540, a roughing vacuum lock module 542 and an exit conveyor 544 in a series configuration.

Figure 13:
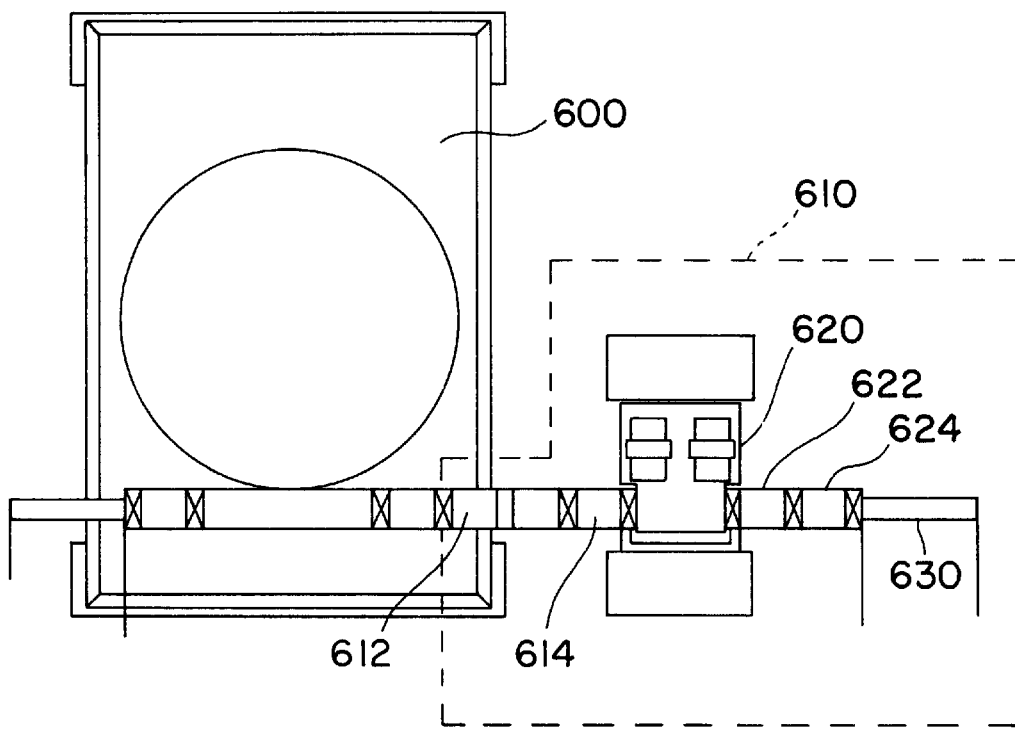
FIG. 13 is a schematic view of a substrate processing system including a primary processing assembly and one output dual processing module in an in-line configuration.

A fourth embodiment of an enhanced substrate processing system in accordance with the invention is shown in FIG. 13. The enhanced substrate processing system includes a primary processing assembly 600 and a secondary processing assembly 610. An example of a suitable primary processing assembly is shown in FIGS. 1 and 2 and described above. The secondary processing assembly 610 is coupled to the output of primary processing assembly 600 through a cassette cooling module 612. The secondary processing assembly 610 includes cassette cooling module 612, a high vacuum lock module 614, a dual processing module 620, a high vacuum lock module 622, a roughing vacuum lock 624 and an exit conveyor 630 in a series configuration. The modular substrate processing system of FIG. 13 has an in-line configuration and does not utilize vacuum rotation modules.

Figure 14:
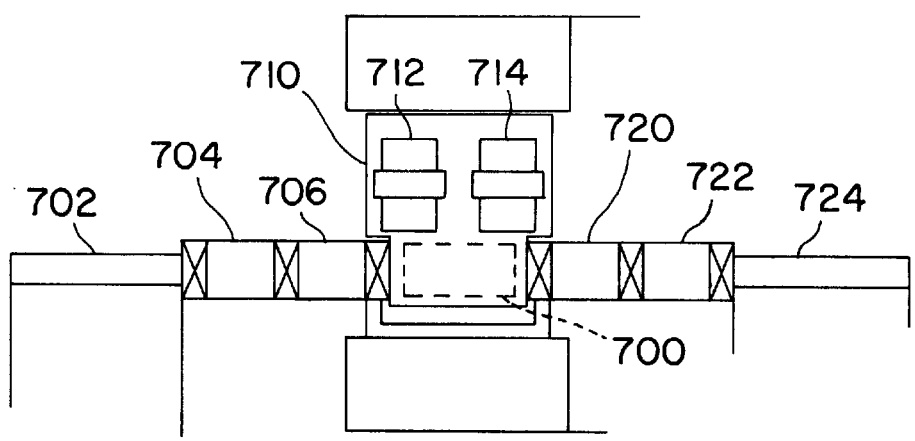
FIG. 14 is a schematic view of a stand-alone dual processing module system.

The embodiments of the enhanced substrate processing system of the present invention shown in FIGS. 10–13 and described above illustrate the modular nature of the system. In particular, the enhanced substrate processing system includes a primary processing assembly, configured as shown by way of example in FIGS. 1 and 2, and a secondary processing assembly. The secondary processing assembly is configured as one or more interconnected modules. The secondary processing assembly may be connected to the output of the primary processing assembly, the input of the primary processing assembly, or both. The enhanced substrate processing system may be configured by appropriate interconnection of modules to form the secondary processing assembly. In each case, the substrates remain in vacuum as they are transported through the system and are processed. Furthermore, vacuum locks may be used between the primary processing assembly and the secondary processing assembly to ensure that contaminants remain confined to the area where they are generated. In addition, the system can be configured for the movement of individual substrates carried to and through the processing stations or the movement of cassettes carrying substrates to and through the processing stations, A stand-alone substrate processing system incorporating a dual processing module in accordance with the invention is shown in FIG. 14. A cassette 700 containing substrates is transported via an entrance conveyor 702, a roughing vacuum lock module 704 and a high vacuum lock module 706 into a dual processing module 710. Dual processing module 710 includes process stations 712 and 714. As described in detail below, dual processing module 710 may operate in a serial mode or in a parallel mode. In the serial mode, each substrate is processed in both of the process stations 712 and 714. In the parallel mode, odd numbered substrates are processed in one of the process stations and even numbered substrates are processed in the other of the process stations. Following processing, the cassette 700 containing the processed substrates is transported from dual processing module 710 through a high vacuum lock module 720, a roughing vacuum lock module 722 and an exit conveyor 724.

Figure 15:
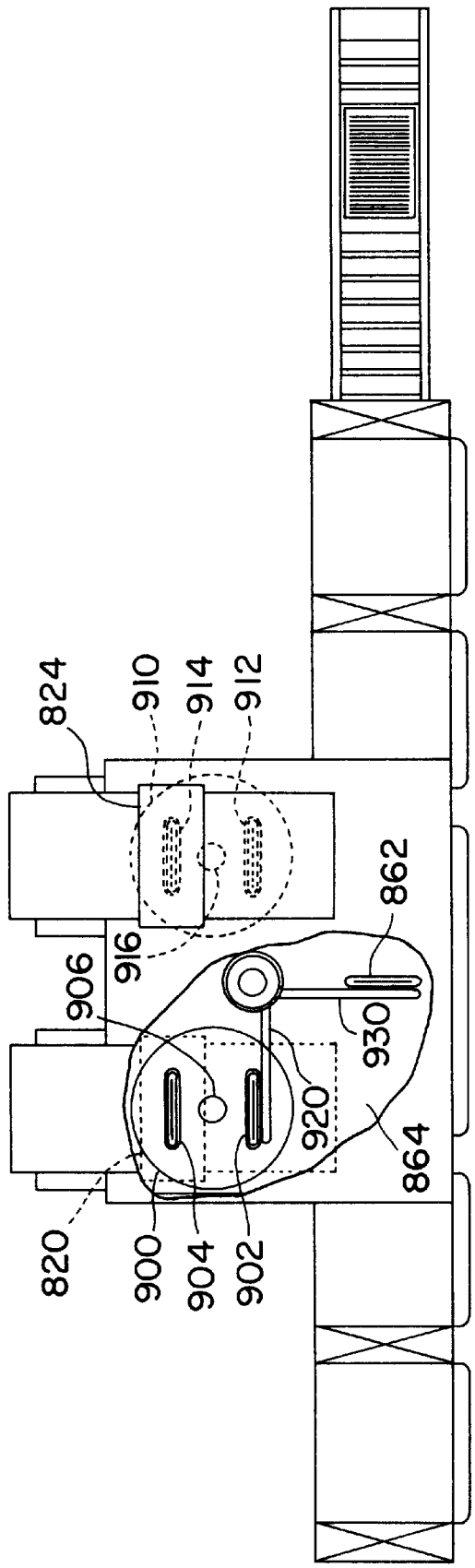
FIG. 15 is a simplified schematic top view of a dual processing module.
Figure 16:
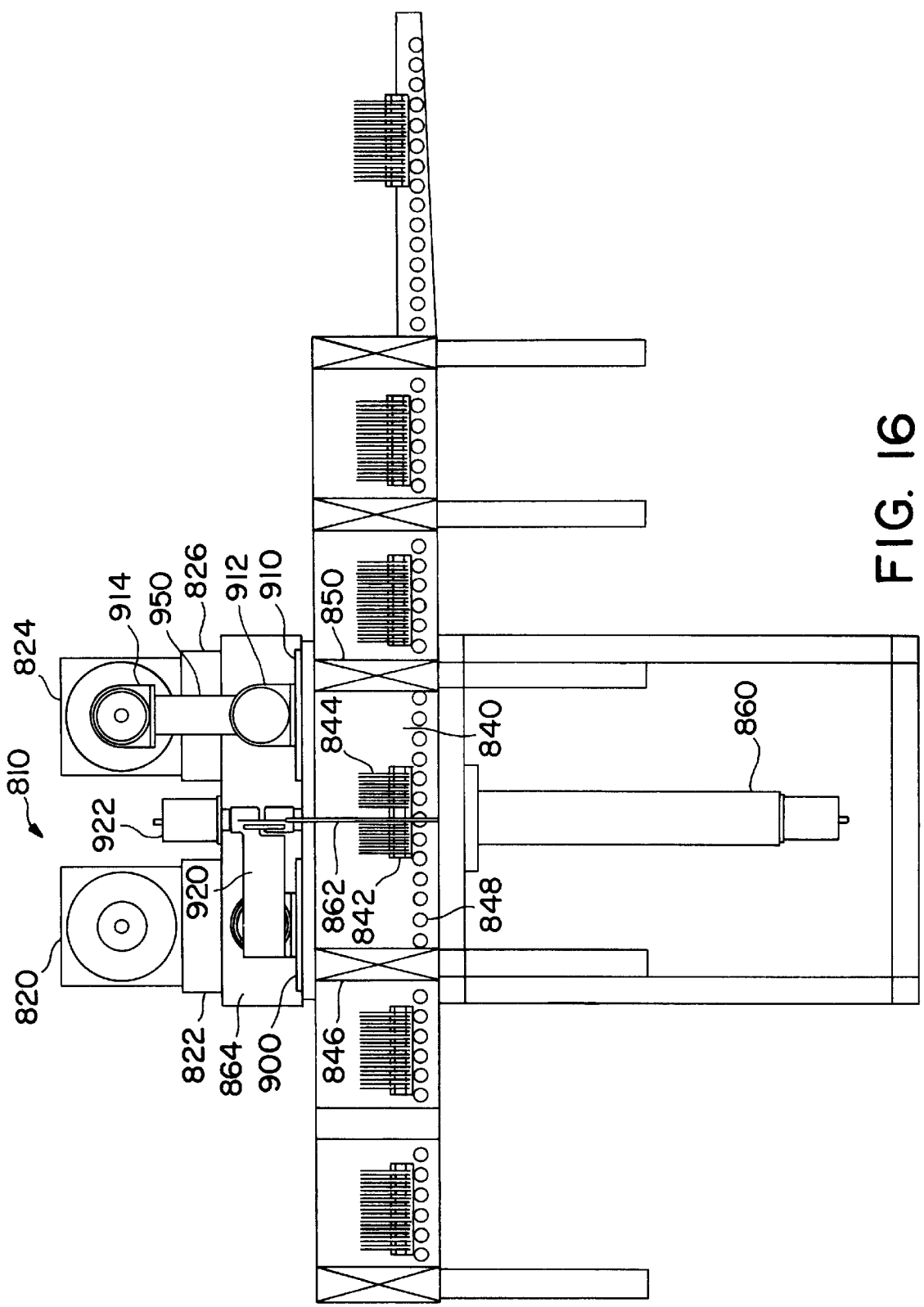
FIG. 16 is a simplified schematic front view of the dual processing module of FIG. 15.
Figure 17:
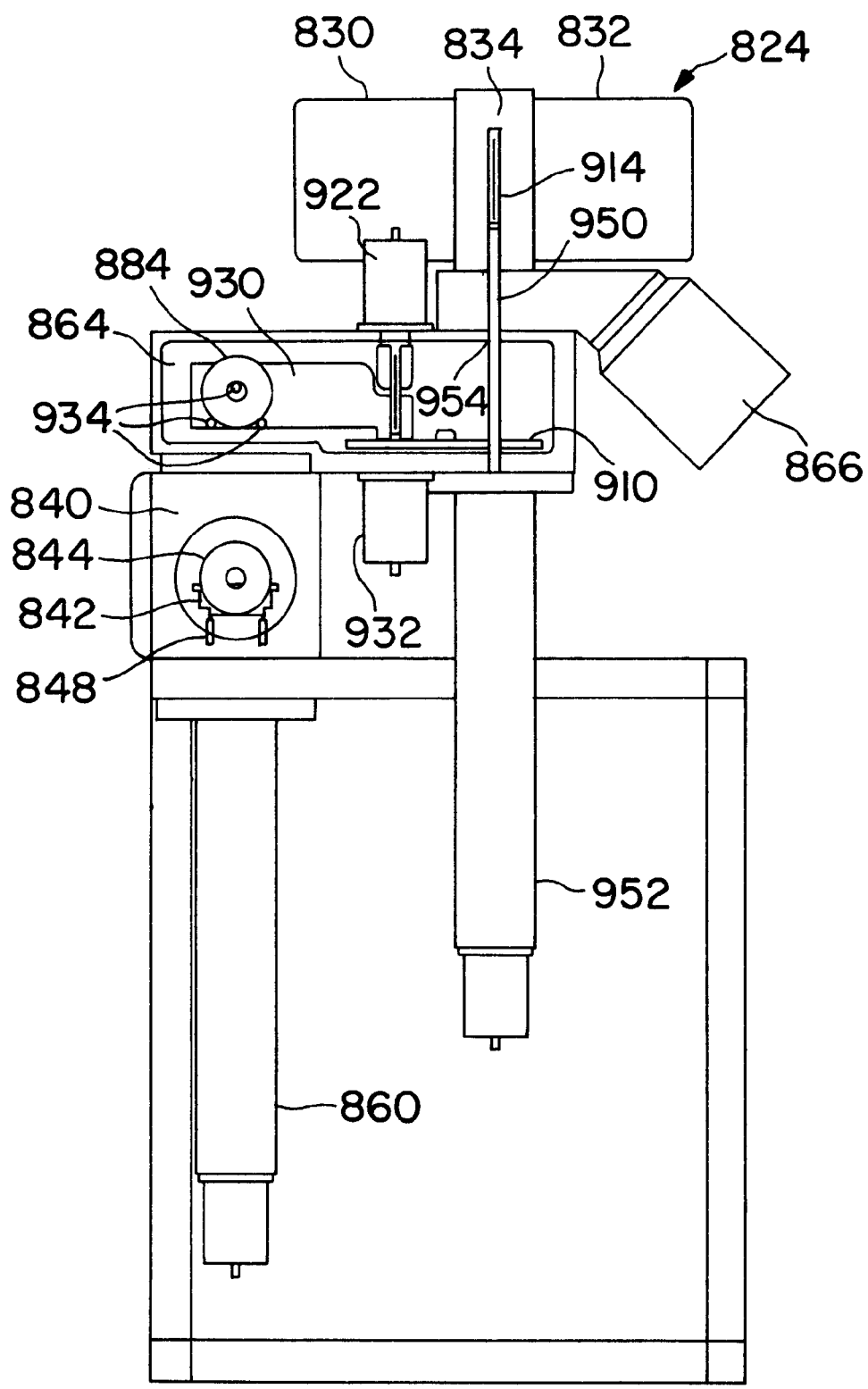
FIG. 17 is a simplified schematic side view of the dual processing module of FIG. 15.

A dual processing module in accordance with a feature of the invention is shown in FIGS. 15–17. A dual processing module 810 includes a process station 820, mounted on a process station base 822 and a process station 824, mounted on a process station base 826. As best shown in FIG. 17, each process station 820, 824, includes processing devices 830 and 832 mounted on opposite sides of a process position 834. Processing devices 830 and 832 may comprise sputter coating sources, for example. Preferably, process stations 820 and 824 are easily removable from the respective process station bases 822 and 826.

The dual processing module 810 further includes a cassette vacuum chamber 840 for receiving a cassette 842 containing substrates 844. Cassette 842 is transported on a conveyor 848 into cassette vacuum chamber 840 through a gate valve 846 and is transported from cassette vacuum chamber 840 through a gate valve 850. Substrates are raised from and lowered into cassette 842 by a substrate lift mechanism 860. Substrate lift mechanism 860 may include a lift blade 862 having an arcuate grooved upper edge, as known in the art. A substrate is lifted from cassette 842 into a transfer vacuum chamber 864. A turbomolecular vacuum pump 866 is coupled to transfer vacuum chamber 864. The transfer vacuum chamber 864 contains a first transfer mechanism for transferring substrates to and between the substrate lift mechanism 860 and process station 820, and a second transfer mechanism for transferring substrates to and between the substrate lift mechanism 860 and process station 824. The first and second transfer mechanisms each include a turntable assembly, a swing arm assembly and a gripper lift assembly.

The turntable assembly for the first transfer mechanism includes a turntable 900 coupled to a drive motor (not shown). Substrate grippers 902 and 904 are mounted on turntable 900 and are spaced apart by 180° with respect to an axis of rotation 906 of turntable 900. Similarly, a turntable assembly for the second transfer mechanism includes a turntable 910 coupled to a drive motor (not shown). Substrate grippers 912 and 914 are mounted on turntable 910 and are spaced apart by 180° with respect to an axis of rotation 916 of turntable 910.

The swing arm assembly for the first transfer mechanism includes a swing arm 920 coupled to a swing arm motor 922.

The swing arm assembly for the second transfer mechanism includes a swing arm 930 coupled to a swing arm motor 932. Each of the swing arms 920 and 930 is provided with substrate support elements 934, which may be grooved elements for supporting a substrate 884. Swing arm 920 swings between a position aligned with lift blade 862 and a load/unload position aligned with substrate gripper 902. Similarly, swing arm 930 swings between a position aligned with lift blade 862 and a load/unload position aligned with substrate gripper 912.

The gripper lift assembly for the second transfer mechanism includes a gripper shaft 950 for supporting one of the substrate grippers 912 and 914, and a gripper lift actuator 952 for moving gripper shaft 950 and the substrate gripper between a preprocess position on turntable 910 and the process position 834 within process station 824. A gripper lift assembly for the first transfer mechanism, not shown, has the same configuration as the gripper lift assembly for the second transfer mechanism.

In operation, a substrate is lifted from cassette 842 by lift blade 862. One of the swing arms, such as swing arm 930, removes the substrate from lift blade 862 and rotates the substrate to the load/unload position of turntable 910. The substrate is transferred to one of the grippers, such as gripper 914, on turntable 910. Turntable 910 is then energized, and the substrate gripper carrying the substrate is rotated by 180° to the preprocess position. Then the gripper lift actuator 952 is energized, and the gripper shaft 950 lifts the substrate gripper 914 carrying the substrate into the process position 834 in process station 824. As gripper shaft 950 raises the substrate gripper 914 into the process chamber, a seal is formed at location 954, thereby isolating process station 824 from transfer vacuum chamber 864. Following processing, the above sequence is reversed and the substrate is returned to the same slot in cassette 842. The serial and parallel modes of operation are described in detail below.

The enhanced substrate processing systems shown in FIGS. 10–13, the stand-alone substrate processing system shown in FIG. 14 and the dual processing module shown in FIGS. 15–17 have been described in connection with a cassette for transporting substrates through the system. The systems may be configured for operation with standard cassettes as utilized in the disk processing industry. However, it will be understood that the systems may be configured for operation with non-standard cassettes or with any other suitable substrate holder. Furthermore, the systems may be configured such that the substrates are transported individually, in vacuum, from the cassette or other substrate holder to a single process station, to two or more process stations or to all of the process stations in the system before they are returned to the cassette or other substrate holder.

Figure 18:
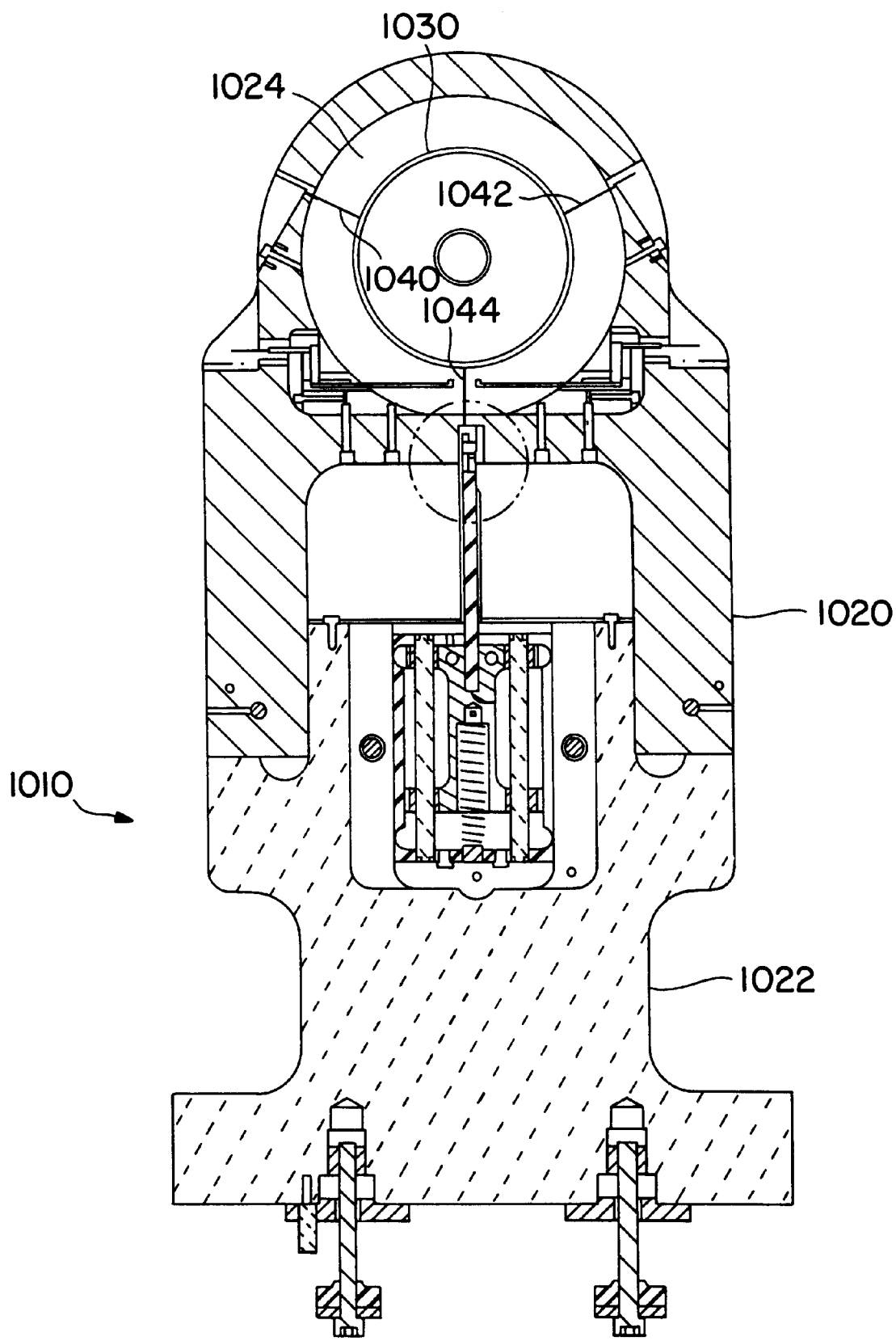
FIG. 18 is a front elevation view of a disk gripper utilized in the substrate processing system.

A disk gripper suitable for use in the dual processing module of FIGS. 15–17 is shown in FIG. 18. A disk gripper 1010 includes a gripper body 1020 supported by a pedestal 1022. In the embodiment of FIG. 18, gripper body 1020 has a circular opening 1024 in which a substrate 1030 is held. Gripper fingers 1040, 1042 and 1044 are mounted to gripper body 1020 and support substrate 1030 at three points spaced apart by 120°. Gripper finger 1044 is retracted for loading and unloading of substrate 1030 by the respective swing arms.

Figure 19:
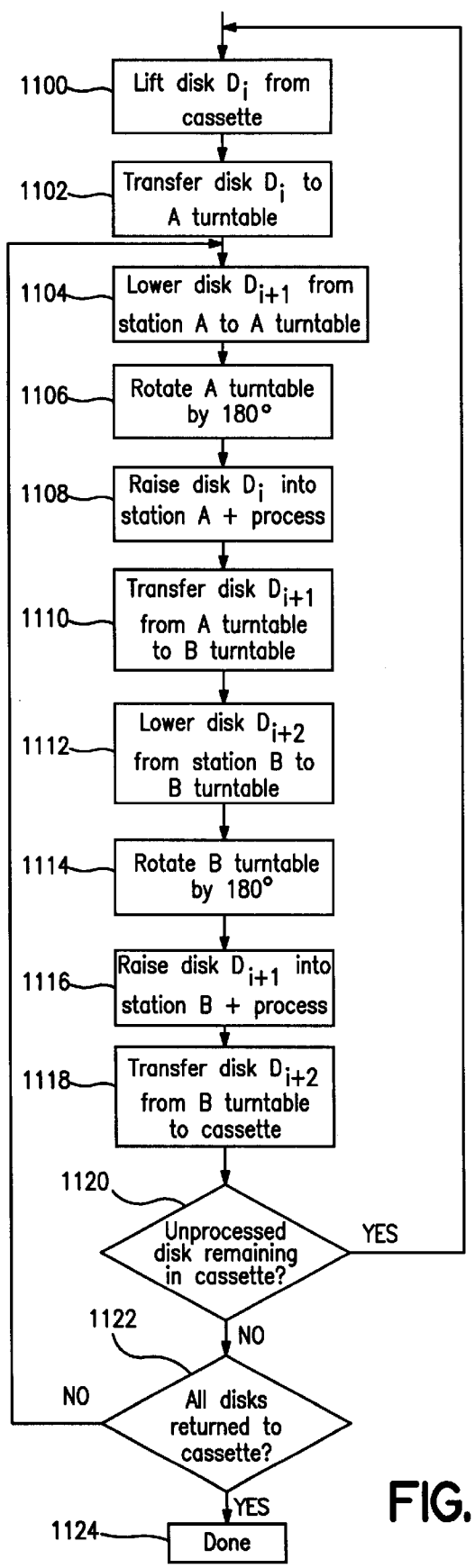
FIG. 19 is a flow chart that illustrates serial operation of the dual processing module.

A flow chart of an example of serial operation of the dual processing module is shown in FIG. 19. Each disk in cassette 842 is designated as disk $D_i$, where i is an index that identifies a particular disk. FIG. 19 illustrates serial operation of the dual processing module at an intermediate stage.

Initially, it is assumed that a disk $D_{i+1}$, is in process station 820 and that a disk $D_{i+2}$ is in process station 824. In step 1100, disk $D_i$ is lifted from cassette 842 by lift blade 862. In step 1102, disk $D_i$ is transferred by swing arm 920 from lift blade 862 to gripper 902 on A turntable 900. In step 1104, partially processed disk $D_{i+1}$ is lowered from process station 820 to A turntable 900. In step 1106, A turntable 900 is rotated by 180°. In step 1108, disk $D_i$ is raised into station 820 and is processed. In step 1110, disk $D_{i+1}$ is transferred from A turntable 900 to B turntable 910 by swing arms 920 and 930. In step 1112, processed disk $D_{i+2}$ is lowered by gripper shaft 950 from station 824 to B turntable 910. In step 1114, B turntable 910 is rotated by 180°. Disk $D_{i+1}$ is raised by gripper shaft 950 into station 824 and is processed in step 1116. In step 1118, disk $D_{i+2}$ is transferred by swing arm 930 and lift blade 862 from B turntable 910 to cassette 842. In step 1120, a determination is made as to whether any unprocessed disks remain in cassette 844. This determination may be based on maintaining a count of the disks processed from the cassette or by a disk sensor located in proximity to cassette 842. If an unprocessed disk remains in cassette 842, the process returns to step 1100. If there are no unprocessed disks remaining in cassette 842, a determination is made in step 1122 as to whether all disks have been returned to cassette 842. If one or more disks has not been returned to cassette 842, the process returns to step 1104 to continue processing of the remaining disks. When all disks have been returned to cassette 842, the process is complete in step 1124. It may be noted that each disk $D_i$ is processed in both station 820 and station 824 in the serial mode.

Figure 20:
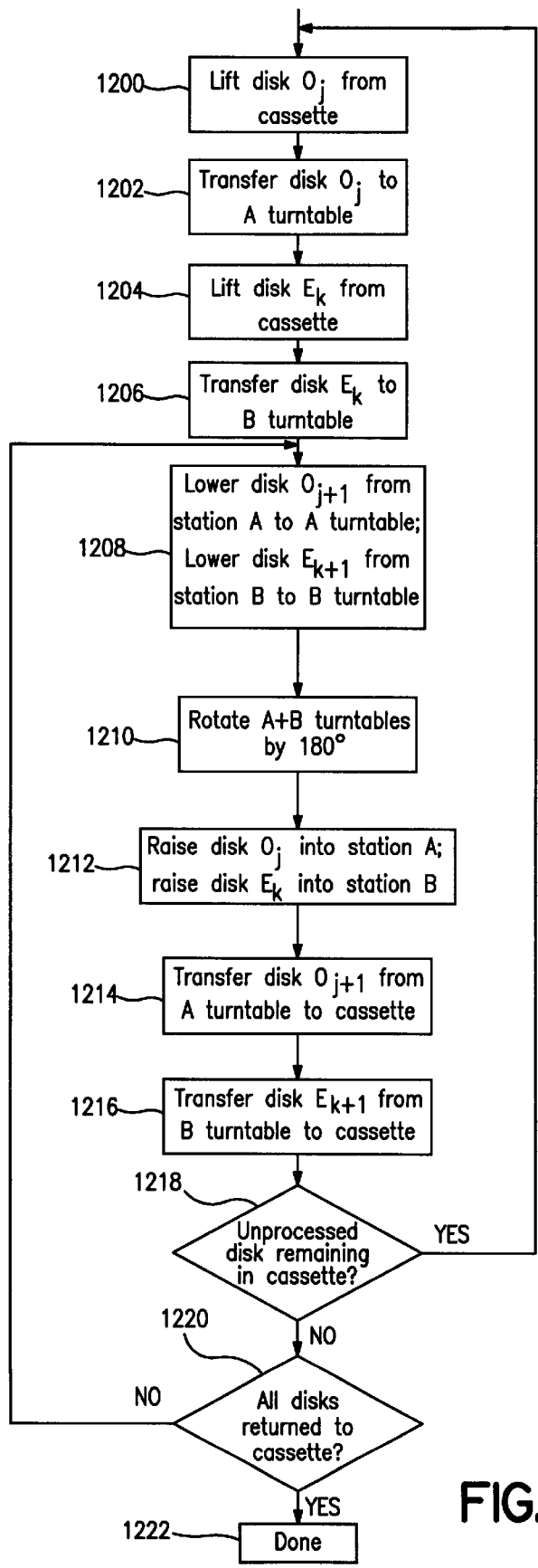
FIG. 20 is a flow chart that illustrates parallel operation of the dual processing module.

A flow chart of an example of parallel operation of the dual deposition module is shown in FIG. 20. In the following discussion, each odd numbered disk in cassette 842 is designated as disk $O_j$ and each even numbered disk in cassette 842 is designated as disk $E_k$, where j and k are indices that identify particular disks. FIG. 20 illustrates parallel operation of the dual processing module at an intermediate stage. Initially, it is assumed that a disk $O_{j+1}$ is in process station 820 and that a disk $E_{k+1}$ is in process station 824. In step 1200, an odd numbered disk $O_j$ is lifted from cassette 842 by lift blade 862. Disk $O_j$ is transferred by swing arm 920 from lift blade 862 to gripper 902 on A turntable 900 in step 1202. In step 1204, an even numbered disk $E_k$ is lifted from cassette 842 by lift blade 862. In step 1206, disk $E_k$ is transferred by swing arm 930 from lift blade 862 to gripper 912 on B turntable 910. In step 1208, processed disk $O_{j+1}$ is lowered from process station 820 to A turntable 900, and processed disk $E_{k+1}$ is lowered by gripper shaft 950 from process is station 824 to B turntable 910. In step 1210, turntables 900 and 910 are rotated by 180°. In step 1212, disk $O_j$ is raised from turntable 900 to process station 820, and disk $E_k$ is raised from turntable 910 to process station 824. In step 1214, disk $O_{j+1}$ is transferred by swing arm 920 from A turntable 900 to lift blade 862. Disk $O_{j+1}$ is lowered into cassette 842 by lift blade 862. In step 1216, disk $E_{k+1}$ is transferred by swing arm 930 from B turntable 910 to lift blade 862. Disk $E_{k+1}$ is lowered into cassette 842 by lift blade 862. In step 1218, a determination is made as to whether any unprocessed disks remain in cassette 842. If an unprocessed disk remains in cassette 842, the process returns to step 1200. If there are no unprocessed disks remaining in cassette 842, a determination is made in step 1220 as to whether all disks have been returned to cassette 842. If all disks have not been returned to cassette 842, the process returns to step 1208 to continue processing of the remaining disks.

When all disks have been returned to cassette 842, the process is complete in step 1222.

The controller 166 (FIG. 5) of the dual processing module controls the elements of the module for operation in the serial mode or in the parallel mode.

The serial mode or the parallel mode may be selected based on the requirements of the application. In particular, the controller 166 controls the substrate lift mechanism 860, process stations 820 and 824, turntables 900 and 910, swing arms 920 and 930, and the gripper lift assemblies to implement serial operation as shown in FIG. 19 or parallel operation as shown in FIG. 20.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A substrate processing system comprising:
   a primary processing assembly having a generally circular configuration comprising a central vacuum chamber for receiving and processing substrates, a plurality of process stations attached to said vacuum chamber substantially along the circumference of said circular configuration for individually processing substrates serially fed to said process stations, and transport means for transporting said substrates individually and serially to and from said process stations and through said vacuum chamber, said transport means also transporting said substrates out of said primary processing assembly;
   a secondary independent processing assembly as a modular attachment attachable to said primary processing assembly comprising at least one process station for processing said substrates; and
   a vacuum conveyor for transporting substrates in vacuum between said primary processing assembly and said secondary processing assembly, wherein the substrates are maintained in vacuum during transport and feeding of said substrates for processing in said secondary processing assembly.

2. A substrate processing system in accordance with claim 1 in which said at least one process station in said secondary processing assembly is adapted to deposit a thin layer on a substrate being processed therein.

3. A substrate processing system as defined in claim 2, wherein said process station in said secondary processing assembly is isolated from said primary processing assembly.

4. A substrate processing system as defined in claim 1, wherein said primary processing assembly includes a load port and an unload port and wherein said secondary processing assembly is coupled to the unload port of said primary processing assembly through said vacuum conveyor.

5. A substrate processing system as defined in claim 1, wherein said primary processing assembly includes an unload port and wherein said secondary processing assembly comprises one or more modules coupled to the unload port.

6. A substrate processing system as defined in claim 5, wherein said one or more modules comprises a processing module having an input and an output, a first vacuum isolation module coupled between the unload port of said primary processing assembly and the input of said processing module, an d a vacuum lock module coupled to the output of said processing module.

7. A substrate processing system as defined in claim 5, wherein said processing module comprises a vacuum lubrication processing module.

8. A substrate processing system as defined in claim 5, further comprising an isolation compartment between said primary processing assembly and said secondary processing assembly, wherein said primary processing assembly is isolated by said isolation compartment from said secondary processing assembly.

9. A substrate processing system as defined in claim 1, wherein said secondary processing assembly comprises a dual processing module including a vacuum chamber for receiving substrates, first and second process stations, and means for transporting substrates, under vacuum, into and between the process stations.

10. A substrate processing system as defined in claim 1, wherein said secondary processing assembly comprises a cooling module for cooling substrates processed in said primary processing assembly.

11. A substrate processing system as defined in claim 1, wherein said vacuum conveyor comprises a vacuum conveyor module having a roughing vacuum pump connected thereto.

12. A substrate processing system in accordance with claim 1 in which substrates are fed into said primary processing assembly from a substrate holder and are fed from said secondary processing assembly in a substrate holder.

13. A substrate processing system as defined in claim 12, wherein said vacuum conveyor comprises a vacuum conveyor module having a high vacuum pump connected thereto and in which substrates move from said primary processing assembly to said secondary processing assembly in a substrate holder.

14. A substrate processing system as defined in claim 13, wherein said vacuum conveyor comprises a rotation module including a mechanism for changing the direction of transport of substrates in the processing system.

15. A substrate processing system as defined in claim 13, wherein said secondary processing system includes a transfer module for transferring substrates from a first substrate holder to a second substrate holder in vacuum.

16. A substrate processing system as defined in claim 1, wherein said primary processing assembly includes a load port and an unload port and wherein said secondary processing assembly is coupled to the unload port of said primary processing assembly through said vacuum conveyor.

17. A substrate processing system as defined in claim 1, wherein said primary processing assembly includes a load port and an unload port and wherein said secondary processing assembly comprises an input section coupled to said unload port and an output section to feed substrates out of said processing system.

18. A substrate processing system as defined in claim 17, wherein the input section and the output section of said secondary processing assembly each comprise a dual processing module.

19. A substrate processing system as defined in claim 1, wherein said primary processing assembly includes a load port and wherein said secondary processing assembly comprises one or more modules coupled to the load port.

20. A substrate processing system as defined in claim 19, wherein said one or more modules comprises a processing module having an input and an output, an isolation chamber coupled between the output of said processing module and the load port of said primary processing assembly, and a vacuum lock module coupled to the input of said processing module.

21. A substrate processing system in accordance with claim 1 in which said secondary independent processing assembly includes a gripper lift assembly for lifting a gripper between a preprocess position and a process position in said process station and wherein said gripper lift assembly comprises a gripper shaft for supporting a substrate gripper and a gripper lift actuator for moving the substrate gripper between the preprocess position and the process position within the process station.

22. A substrate processing system in accordance with claim 1 in which an isolation chamber is positioned to be located between the primary processing system and said modular processing assembly, wherein the primary processing system is isolated by said chamber from said modular processing assembly.

23. A dual processing module comprising:
a housing defining a cassette vacuum chamber;
first and second process stations coupled to said cassette vacuum chamber;
a conveyor for transporting a substrate holder containing substrates into and out of said cassette vacuum chamber;
a substrate lift mechanism for raising a substrate from the substrate holder and for lowering a substrate into the substrate holder; and
first and second transfer mechanisms for transferring substrates to and between the substrate lift mechanism and the first and second process stations,
respectively, comprising a turntable having locations spaced apart by about 180°, and a motor for rotating said turntable.

24. A dual processing module as defined in claim 23 including a transfer arm assembly for moving a substrate between the substrate lift mechanism and a load/unload position and wherein said transfer arm assembly comprises a swing arm having one or more substrate support elements mounted thereon and a swing arm drive motor for rotating the swing arm between the substrate lift mechanism and the load/unload position.

25. A modular processing assembly for use with a primary processing system in which said primary processing system is separated from said modular processing assembly by a load lock, said primary processing system comprising
a vacuum chamber for receiving a substrate holder containing substrates to be coated, a plurality of process stations for serially and individually processing substrates in vacuum, and an exit to transport processed substrates in a substrate holder out of said primary processing system in the manufacture of coated disks,
a load lock to separate the volume of said primary processing assembly from said modular processing assembly;
said modular processing assembly comprising:
an independent vacuum chamber as a modular attachment, attachable to the primary processing system through a load lock including at least one process station adapted to be coordinated to the processing of substrates in the primary processing system, to further process coated disks, coated in said a primary processing system.

26. A modular processing assembly as defined in claim 25 further including a load gate valve at the input end of said modular processing assembly adapted to be positioned against a load lock between said primary processing system and said modular processing assembly.

27. A modular processing assembly as defined in claim 25 including two process stations wherein the first and second process stations of said two process stations are mounted on a process station base and are easily removable from the process station base.

28. A modular processing assembly as defined in claim 27, further comprising means for operating said process stations in a serial mode wherein each of the substrates is processed in said first and second process stations.

29. A modular processing assembly as defined in claim 27, further comprising means for operating said process stations in a parallel mode wherein odd numbered substrates are processed in said first process station and even numbered substrates are processed in said second process station.

30. A modular processing assembly as defined in claim 27, further comprising means for selectively operating said process stations in a serial mode wherein said substrates are processed in said first and second process stations or a parallel mode wherein odd numbered substrates are processed in said first process station and even numbered substrates are processed in said second process station.

31. A modular processing assembly as defined in claim 25, wherein said modular assembly comprises a rotation module, including a mechanism for changing the direction of transport of the substrate holder in vacuum.

32. A modular processing assembly as defined in claim 25, wherein said processing modular assembly further comprises:
   a cassette positioned within said independent vacuum chamber;
   first and second process stations coupled to said independent vacuum chamber;
   a conveyor for transporting the substrate holder containing substrates into and out of said independent vacuum chamber;
   a lift mechanism within said independent vacuum chamber for raising a substrate from the substrate holder and for lowering a substrate into the substrate holder; and
   at least one transfer mechanism for transferring substrates to and between the lift mechanism and the first and second process stations, respectively.

33. A modular processing assembly as defined in claim 25, wherein said modular processing assembly is configured for processing at least two substrates simultaneously.

34. A modular processing assembly for use with a processing system comprising a vacuum chamber for receiving a substrate holder containing substrates and a plurality of primary process stations for serially individually processing said substrates through each of said primary stations and returning said substrates to said substrate holder, said modular processing assembly comprising:
   a processing module comprising at least one secondary process station for processing said substrates with a lubricant in said process station; and
   a vacuum conveyor module for transporting the substrate holder in vacuum between the primary processing system and said processing module, wherein the substrate holder containing substrates is maintained in vacuum during transport.

* * * * *